United States Patent
Kim et al.

(10) Patent No.: US 6,579,755 B2
(45) Date of Patent: Jun. 17, 2003

(54) HIGH DIELECTRIC CAPACITOR AND METHOD OF MANUFACTURING THE SAME

(75) Inventors: You Sung Kim, Seoul (KR); Sang Don Lee, Seoul (KR)

(73) Assignee: Hyundai Electronics Industries, Co., Ltd., Kyungki-do (KR)

(*) Notice: Subject to any disclaimer, the term of this patent is extended or adjusted under 35 U.S.C. 154(b) by 0 days.

(21) Appl. No.: 09/855,973

(22) Filed: May 15, 2001

(65) Prior Publication Data

US 2001/0053058 A1 Dec. 20, 2001

(30) Foreign Application Priority Data

Jun. 19, 2000 (KR) .................... 10-2000-33609

(51) Int. Cl.[7] .................... H01L 21/00; H01L 21/8242
(52) U.S. Cl. .................... 438/240; 438/396
(58) Field of Search .................... 438/3, 238, 240, 438/689, 239, 386, 396; 257/310

(56) References Cited

U.S. PATENT DOCUMENTS 6,144,060 A * 11/2000 Park et al. .................... 257/298
6,171,898 B1 * 1/2001 Crenshaw et al. .................... 438/238
6,177,351 B1 * 1/2001 Beratan et al. .................... 438/694
6,184,074 B1 * 2/2001 Crenshaw et al. .................... 438/238
2001/0005631 A1 * 6/2001 Kim et al. .................... 438/689

FOREIGN PATENT DOCUMENTS

JP   1999-012976   2/1999
JP   1999-027321   4/1999

OTHER PUBLICATIONS

Translation of official action dated Jan. 28, 2003, in counterpart Korean Patent application No. 2000–33609.

* cited by examiner

*Primary Examiner*—William David Coleman
(74) *Attorney, Agent, or Firm*—Marshall, Gerstein & Borun

(57) ABSTRACT

A capacitor having a storage electrode and a plate electrode, wherein both are made of metal or metal oxide, a high dielectric film formed between the electrodes, and a method of manufacturing the same. A diffusion prevention film is found at the side of the storage electrode and on the plate electrode. Therefore, the invention prevents deterioration of the property in the dielectric film due to penetration of hydrogen ions during a subsequent thermal process thereby improving the reliability of a device.

10 Claims, 3 Drawing Sheets

HIGH DIELECTRIC CAPACITOR AND METHOD OF MANUFACTURING THE SAME

BACKGROUND OF THE INVENTION

1. Field of the Invention

The invention relates generally to a method of manufacturing a high dielectric capacitor. More particularly, the present invention relates to a high dielectric capacitor capable of preventing deterioration of dielectric property of a dielectric film generated during a subsequent thermal process.

2. Description of the Prior Art

Generally, as the degree of integration of a semiconductor device such as a DRAM is increased, the area a memory cell occupies in a semiconductor device or chip is rapidly reduced. For the operation of the memory device, however, capacitance of more than a certain amount per unit memory cell is necessarily secured. Therefore, there is a need for development of process technology by which the area occupied by a capacitor can be minimized while maintaining the capacitance necessary for the operation of the memory cell.

In order to secure a capacitance necessary for the operation of a semiconductor device in a limited area, the effective surface area of a storage electrode must be increased or a dielectric material having an improved dielectric property must be used.

Therefore, in compliance with these needs, a capacitor is manufactured using $Ta_2O_5$, BST (barium strontium titanate), or other suitable compounds in a manufacturing process of a device having a memory capacity more than four gigabytes (G). For reference, $Ta_2O_5$ has more than five times the dielectric constant of a conventional dielectric made of an oxide film and a nitride film, and the dielectric constant of BST is higher than that of $Ta_2O_5$. The structure of the capacitor is formed as a MIS (metal insulator silicon) type made of, from top to bottom, a metal electrode, a dielectric, and a silicon electrode; or as a MIM (metal insulator metal) type made of, from top to bottom, a metal electrode, a dielectric, and a metal electrode.

If the lower electrode of the capacitor is formed of a metal instead of polysilicon, as in a MIS type, reduction in the capacitance due to formation of a depletion layer can be prevented. On the other hand, if the lower electrode is formed using polysilicon, as in a MIM type, a depletion layer is necessarily formed during operation of the semiconductor. The depletion layer acts as a capacitor serially connected to the capacitor, which is a component of a DRAM, thus reducing the total capacitance. If the lower electrode is formed of a metal, however, reduction in the capacitance as above is not generated since the thickness of the depletion layer is negligible.

Therefore, as the integration degree of a device is increased, a structure of a capacitor is such that only either an upper electrode or a lower electrode is formed of a metal or both the upper and lower electrodes are formed of metals.

A method of manufacturing a conventional capacitor having a MIM structure in which the upper and lower electrodes are formed of metals will be explained by reference to FIGS. 1A to 1D.

FIG. 1A shows a cross-sectional view of a semiconductor device in which after a first insulating film 3 is formed on a semiconductor substrate 1 in which a junction 2 is formed, the first insulating film 3 is applied in a pattern which exposes the junction 2, forming a contact hole. A plug 4 is formed within the contact hole 2a by stacking polysilicon Ti/TiN 4b on top of 4a. The Ti/TiN 4b acts to reduce contact resistance with a metal electrode formed thereon and to prevent the polysilicon 4a and metal from diffusing.

FIG. 1B shows a cross-sectional view of the semiconductor device in which, after an etching prevention layer 5 and an oxide film 6 are sequentially formed on the entire structure including the plug 4, the oxide film 6 and the etching prevention layer 5 are sequentially patterned. The etching prevention layer 5 is formed by depositing a nitride film with thickness of several hundredths of an angstrom so that loss of the first insulating film 3 can be prevented upon etching the oxide film 6.

FIG. 1C shows a cross-sectional view of the semiconductor device in which, after a metal is deposited on the entire surface, the metal deposited on the oxide film 6 is removed for electrical separation between the memory cells, and a storage electrode 7 is formed at the patterned portion of the oxide film 6 and the etching prevention layer 5 so that it can contact the plug 4. The metal deposited on the oxide film 6 is removed by an etch-back process or chemical mechanical polishing (CMP) process.

FIG. 1D shows a cross-sectional view of the semiconductor device in which, after a dielectric film 8 and a plate electrode 9 are sequentially formed on the entire structure, a second insulating film 10 is formed on the plate electrode 9 so that the surface of the plate electrode 9 is essentially flat. The dielectric film 8 is formed of a high dielectric, e.g., $Ta_2O_5$ or BST.

In case of adopting a COB (capacitor over bit line) structure, after the manufacture of the capacitor as above is completed, a metal wiring is formed. Then, in order to optimize the property of the MOS transistor, a thermal process is performed under a gas atmosphere in which hydrogen ($H_2$) or hydrogen and nitrogen ($N_2$) are mixed. In other words, as a word line, a bit line, a capacitor and a metal wiring are formed after the transistor is formed, during this process, the memory cell is degraded. Dangling bonds are therefore easily formed at the interface, which degrades the dielectric property of the transistor. If the thermal process is performed under a hydrogen gas atmosphere, so that hydrogen atoms can be diffused into the transistor located at the base portion, the dangling bonds are removed yielding a transistor having a desired property.

However, it has been reported that if the above thermal process is performed, the electrical property of the dielectric film is heavily degraded, generating a leakage current. The cause of this problem has yet to be clearly determined but it is thought that the cause are hydrogen atoms that penetrate into the dielectric film 8 during the thermal process, which causes a reduction reaction with the dielectric film since most dielectric films are made of oxide.

Current solutions to this problem include a technology in which a capping layer made of $Al_2O_5$ is formed on the plate electrode (Ru) of a capacitor having a Ru/$Ta_2O_5$/Ru structure in order to prevent penetration of hydrogen ions. However, although penetration of hydrogen ions from the upper plate electrode is blocked, penetration of hydrogen ions from the bottom storage electrode is not blocked. Further problems exist when $SiH_4$ and $NH_3$ are used as a source gas when a nitride film, used as the etching prevention layer 5, is deposited. If hydrogen ions remaining after deposition are not completely removed, the remaining hydrogen ions may penetrate into the dielectric film 8.

SUMMARY OF THE INVENTION

A high dielectric capacitor in which a diffusion prevention film is formed at the side of a storage electrode and on a plate electrode to prevent penetration of hydrogen (H) ions during a subsequent thermal process, and a method of manufacturing the same are described.

In order to accomplish the above, a high dielectric capacitor has a storage electrode and a plate electrode, both made of metal or a metal oxide, and a high dielectric film formed between the electrodes. The dielectric film includes diffusion prevention films for preventing penetration of gas ions formed at the side of the storage electrode and on the plate electrode.

The high dielectric capacitor can be manufactured by the steps of: forming an insulating film on a semiconductor device in which a junction is formed so that the junction is exposed to form a contact hole 2a; forming a plug within the contact hole 2a; sequentially forming a first diffusion prevention film and an oxide film on the entire structure; sequentially patterning the oxide film, the first diffusion prevention film, and the etching prevention layer using a mask; forming a storage electrode at the patterned portions of the oxide film, the first diffusion prevention film, and the etching prevention layer so that the storage electrode contacts the plug; and sequentially forming a dielectric film, a plate electrode, and a second diffusion prevention film on the entire structure.

Preferred embodiments include first and second diffusion prevention films made of $Al_2O_3$ with a thickness between about 5 Å and about 200 Å. Further preferred embodiments include the storage electrode and the plate electrode comprised of a metal or metal oxide selected from Ru, Pt, $RuO_2$, Ir, $TrO_2$, W, WN, and TiN, and the high dielectric selected from the group including $Ta_2O_5$, TaON, and BST.

BRIEF DESCRIPTION OF THE DRAWINGS

The aforementioned aspects and other features will be explained in the following description, taken in conjunction with the accompanying drawings, wherein.

DETAILED DESCRIPTION OF PREFERRED EMBODIMENTS

The invention will be described in detail by way of a preferred embodiment with reference to accompanying drawings.

Figure 1A:
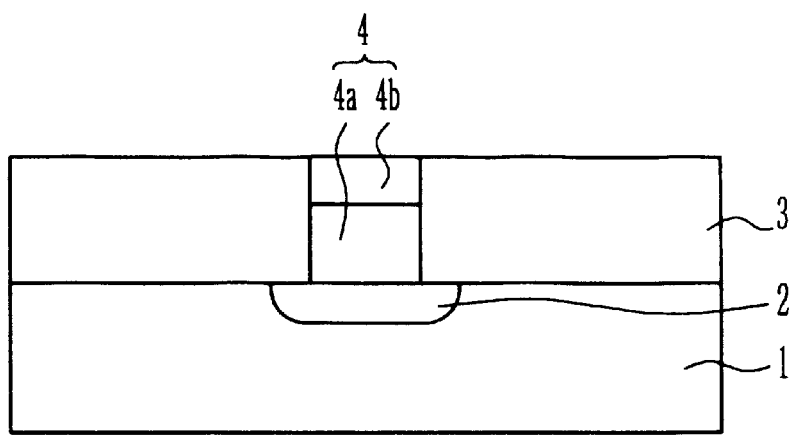
FIGS. 1A to 1D are cross-sectional views for explaining a method of manufacturing a conventional high dielectric capacitor.
Figure 1B:
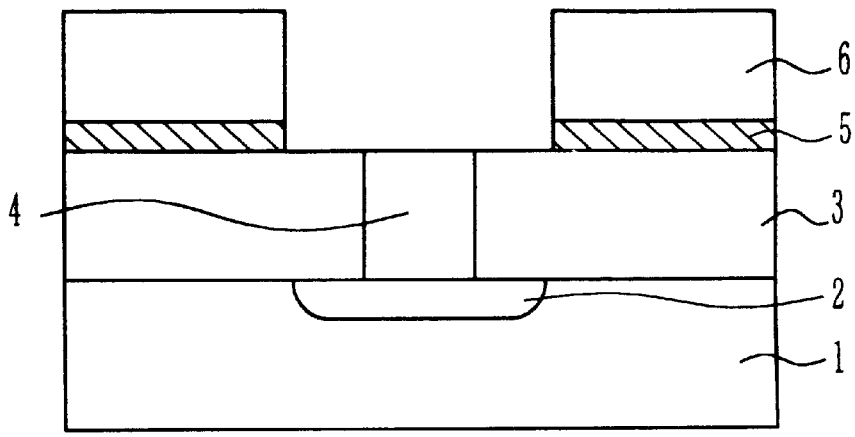
Figure 1C:
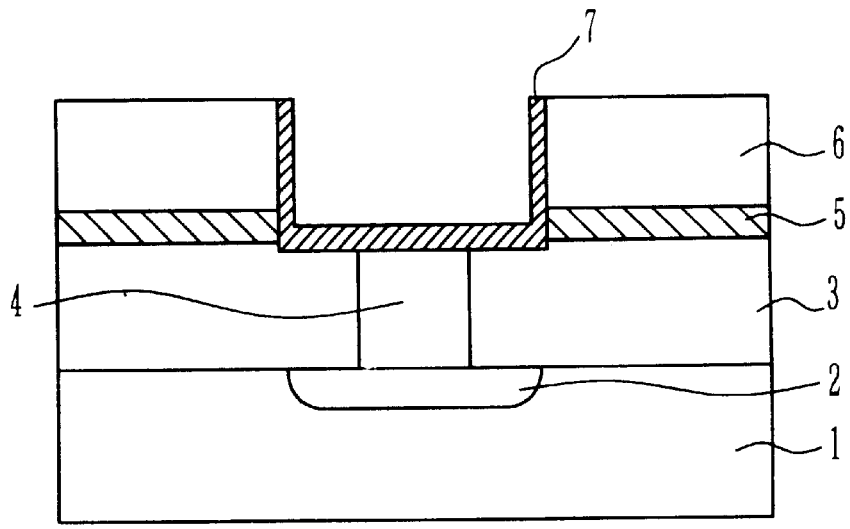
Figure 1D:
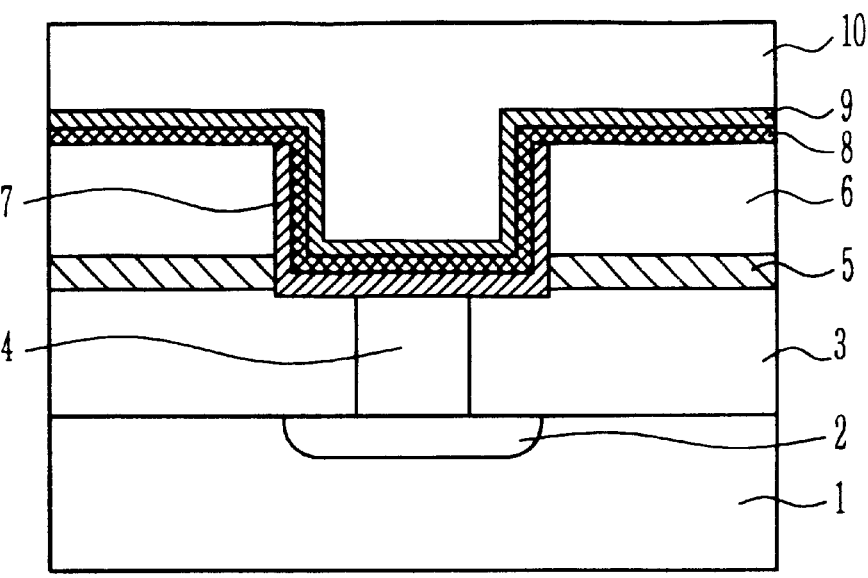
Figure 2A:
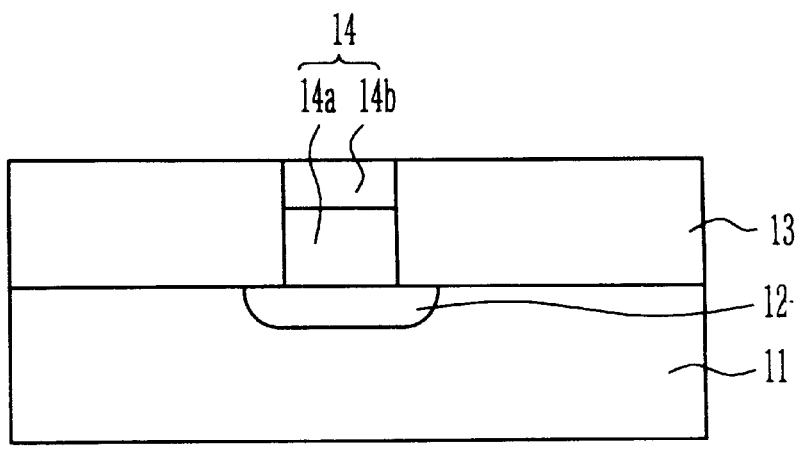
FIGS. 2A to 2E are cross-sectional views for explaining a method of manufacturing a high dielectric capacitor described herein.

As shown in FIG. 2A, a first insulating film 13 is formed on a semiconductor device 11 in which a junction 12 is formed so that the junction 12 is exposed to form a contact hole 12a. Then, a plug 14 is formed within the contact hole 12a. The plug 14 is formed by stacking polysilicon 14a and Ti/TiN 14b. The Ti/TiN 14b acts to reduce the contact resistance with a metal electrode to be formed thereon and to prevent the polysilicon 14a and a metal from diffusing each other. Ti/TiAlN or Ti/TiSiN may be used instead of Ti/TiN.

Figure 2B:
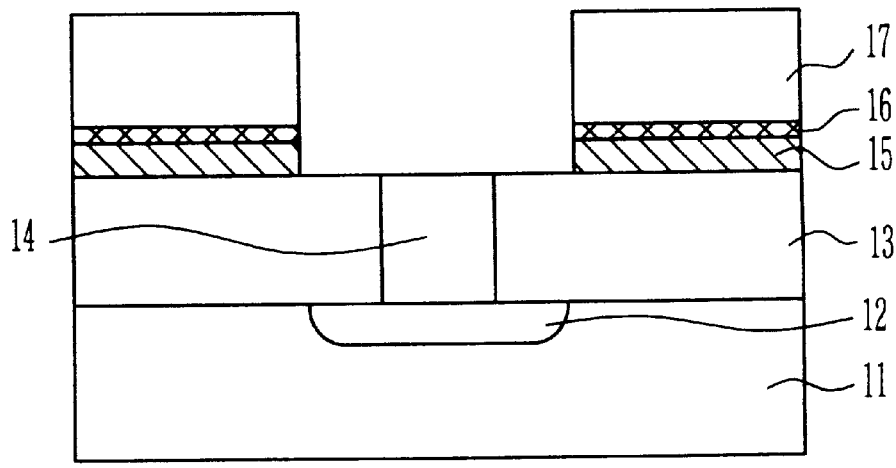

Referring to FIG. 2B, an etching prevention layer 15, a first diffusion prevention film 16, and an oxide film 17 are sequentially formed on the entire structure, including the plug 14. The oxide film 17, the first diffusion prevention film 16, and the etching prevention layer 15 are sequentially patterned using a mask for storage electrode. The etching prevention layer 15 is formed by depositing a nitride film to a thickness between about 500 Å and about 1000 Å so that loss of the first insulating film 13 is prevented when the oxide film 17 is etched. The first diffusion prevention film 16 is formed by depositing $Al_2O_3$ to a thickness between about 50 Å and about 200 Å by utilizing an atomic layer deposition (ALD) method, and the oxide film 17 has a thickness between about 5000 Å and about 12000 Å so that it can exhibit a sufficient capacitance.

Figure 2C:
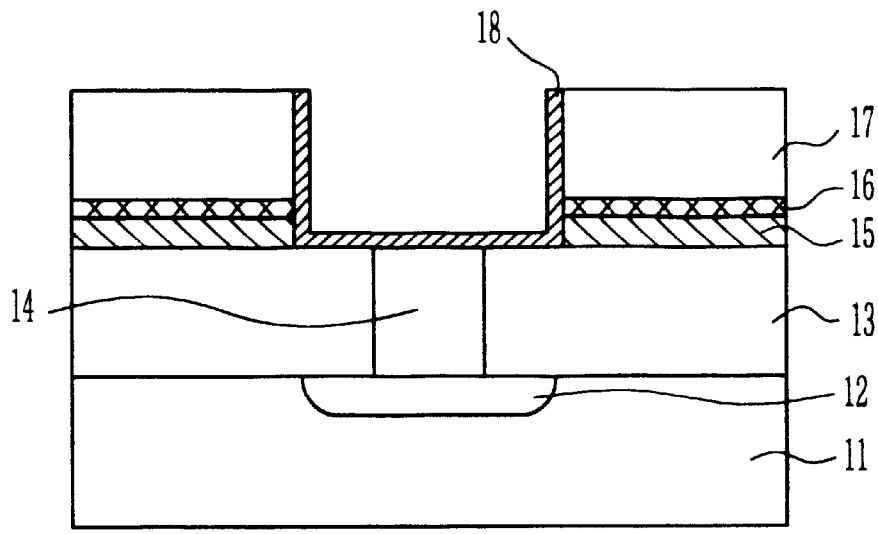

Referring to FIG. 2C, a metal or metal oxide, preferably including at least one of Ru, Pt, $RuO_2$, Ir, $IrO_2$, W, WN, and TiN, is deposited to a thickness between about 200 Å and about 400 Å on the entire structure. The metal deposited on the oxide film 17 is removed in order to electrically separate the memory cells. Thus, a storage electrode 18 is formed at the portion in which the oxide film 17, the first diffusion prevention film 16 and the etching prevention layer 15 are patterned so that the storage electrode can contact the plug 14. The metal deposited on the oxide film 17 is removed by utilizing an etch-back process or a chemical mechanical polishing (CMP).

Figure 2D:
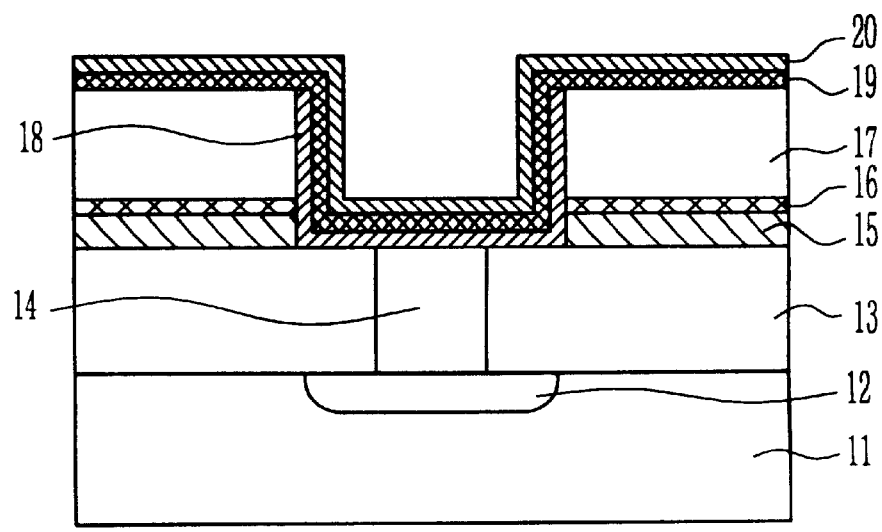

FIG. 2D shows a cross-sectional view of the device in which a dielectric film 19 and a plate electrode 20 are sequentially formed on the entire structure. The process of forming the dielectric film 19 includes depositing a high dielectric, e.g., $Ta_2O_5$, $TaON$, or BST, to a thickness between about 100 Å and about 250 Å by utilizing a chemical vapor deposition (CVD) method having a good coverage property, and then performing a low-temperature thermal process at a temperature range between about 350° C. and about 450° C. by utilizing an oxygen ($O_2$) plasma or $UV/O_3$ method, or by performing a high-temperature thermal process in a reactive furnace or a rapid thermal processing equipment having a temperature range between about 550° C. and about 700° C. so that organic impurity contained in the source can be removed. The plate electrode 20 is formed of a metal or metal oxide, preferably including at least one of Ru, Pt, $RuO_2$, Ir, $IrO_2$, W, WN, and TiN.

Additionally, it is preferred that $Ta_2O_5$ and TaON are formed with a thickness between about 100 Å and about 150 Å and the BST is formed with a thickness between about 150 Å and about 250 Å.

Figure 2E:
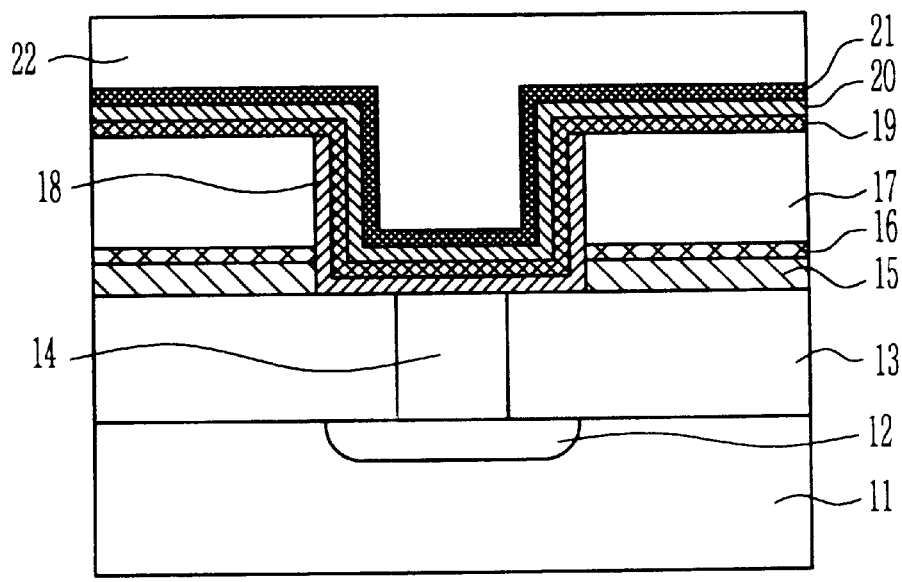

FIG. 2E shows a cross-sectional view of the device in which $Al_2O_3$ is deposited at a thickness between about 50 Å and about 200 Å on the plate electrode 20 by utilizing the ALD method to form a second diffusion prevention film 21. A second insulating film 22 is then formed on the second diffusion prevention film 21 so that the surface of the second diffusion prevention film is essentially flat.

In the capacitor manufactured as above, penetration of hydrogen ions from the etching prevention layer 15 and the bottom can be prevented by the presence of the first diffusion prevention film 16. Also, penetration of hydrogen ions from the outside can be prevented by the presence of the second prevention film 21. In this way deterioration of the dielectric property of the dielectric film 19 due to penetration of hydrogen ions does not occur.

As the property of the dielectric film is preserved, degradation of reliability of a device due to generation of a leakage current can be prevented. Also, the invention can maintain the property of a MOS transistor at an optimal state by eliminating the problems generated during a thermal process. Further, the invention makes it possible to effectively generate a desired capacitance depending on the use of a dielectric and a metal electrode, thus facilitating a higher integration of a device.

The invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed are:

1. A method of manufacturing a high dielectric capacitor, comprising the steps of:

forming an insulating film on a semiconductor device defining a junction;

exposing the junction to form a contact hole;

forming a plug within said contact hole;

sequentially forming a first diffusion prevention film and an oxide film on the entire structure, the first diffusion prevention film comprising $Al_2O_3$;

sequentially patterning portions of the oxide film, the first diffusion prevention film, and an etching prevention layer using a mask;

forming a storage electrode at the patterned portions of said oxide film, the first diffusion prevention film, and the etching prevention layer so that the storage electrode contacts the plug; and sequentially forming a dielectric film, a plate electrode, and a second diffusion prevention film on the entire structure, the second diffusion prevention film comprising $Al_2O_3$.

2. The method of claim 1, wherein the plug forming step comprises stacking polysilicon and Ti/TiN in the contact hole.

3. The method of claim 1, wherein the etching prevention film comprises a nitride film having a thickness between about 500 Å and about 1000 Å.

4. The method of claim 1, wherein the first and second diffusion prevention films have a thickness between about 50 Å and about 200 Å.

5. The method of claim 1, wherein the oxide film has a thickness between about 5000 Å and about 12000 Å.

6. The method of claim 1, wherein the storage electrode and said plate electrode are formed of a metal or metal oxide selected from the group consisting of Ru, Pt, $RuO_2$, Ir, $IrO_2$, W, WN and TiN.

7. The method of claim 1, wherein the storage electrode has a thickness between about 200 Å and about 400 Å.

8. The method of claim 1, comprising the step of forming the dielectric film by depositing a high dielectric having a thickness between about 100 Å and about 250 Å by using a chemical vapor deposition method and performing a low-temperature thermal process at a temperature range between about 350° C. and about 450° C.

9. The method of claim 8 wherein the high dielectric comprises a metal containing compound selected from the group consisting of $Ta_2O_5$, TaON and BST.

10. The method of claim 1, comprising the step of forming the dielectric film by depositing a high dielectric having a thickness between about 100 Å and about 250 Å by using a chemical vapor deposition method and performing a high temperature thermal process at a temperature range between about 550° C. and about 700° C.

* * * * *